United States Patent [19]
Menigaux

[11] Patent Number: 5,930,278
[45] Date of Patent: Jul. 27, 1999

[54] MULTI-WAVELENGTH LASER-EMITTING COMPONENT

[75] Inventor: Louis Menigaux, Bures sur Yvette, France

[73] Assignee: France Telecom, France

[21] Appl. No.: 08/789,846

[22] Filed: Jan. 28, 1997

[30] Foreign Application Priority Data

Jan. 29, 1996 [FR] France ................................ 96 00988

[51] Int. Cl.[6] .............................. H01S 3/19; H01S 3/08
[52] U.S. Cl. ............................................ 372/50; 372/96
[58] Field of Search ................................ 372/23, 96, 50, 372/102

[56] References Cited

U.S. PATENT DOCUMENTS

| | | | |
|---|---|---|---|
| 4,309,667 | 1/1982 | Di Forte et al. ............................ | 372/50 |
| 4,318,058 | 3/1982 | Mito et al. .................................. | 372/50 |
| 4,993,036 | 2/1991 | Ikeda et al. ................................ | 372/50 |
| 5,384,797 | 1/1995 | Welch et al. ............................... | 372/23 |

FOREIGN PATENT DOCUMENTS

| | | | |
|---|---|---|---|
| A-0 361 399 | 9/1989 | European Pat. Off. .......... | H01S 3/25 |

OTHER PUBLICATIONS

Journal of Vacuum Science and Technology Part B, vol. 13, No. 6, Nov. 1995, New York, pp. 2722–2724 Templeton et al, "Focused Ion Beam Lithography of Multiperiod Gratings . . . ".

Electronics Letters, vol. 29, No. 25, Dec. 9, 1993, Stevenage GB, pp. 2195–2197 by Katoh et al, "DBR Laser Array for WDM System".

IEEE Photonics Technology Letter, vol. 5, No. 9, Sep. 1993, pp. 978–980, by Tsang et al "Control of Lasing Wavelength . . . ".

Applied Physics Letters, vol. 53, No. 12, Sep. 19, 1988, pp. 1036–1038 by Koch et al "High–Performance Tunable 1.5 $\mu$m . . . ".

Journal of Lightwave Technology, vol. 9, No. 12, Dec. 1991, New York, pp. 1665–1673 by Chang–Hasnain et al "Monolithic Multiple Wavelength Surface Emitting Laser Arrays".

Journal of Vacuum Science and Technology: Part B, vol. 11, No. 6, Nov. 1993, New York, pp. 2509–2513 Tennant et al, "Multiwavelength Distributed Bragg Reflector . . . ".

*Primary Examiner*—Rodney Bovernick
*Assistant Examiner*—Quyen Phan Leung
*Attorney, Agent, or Firm*—Blakely Sokoloff Taylor & Zafman

[57] ABSTRACT

A multi-wavelength laser-emitting component presenting a plurality of Bragg grating laser-emitting sources, wherein the Bragg gratings of said sources correspond to a diffraction grating common to the various sources, with the pitch thereof varying continuously from one source to another.

4 Claims, 1 Drawing Sheet

MULTI-WAVELENGTH LASER-EMITTING COMPONENT

The present invention relates to a multi-wavelength laser-emitting component.

Advantageously, it has a particular application in wavelength multiplexing for optical telecommunications.

BACKGROUND OF THE INVENTION

Laser emission sources that are tunable in wavelength have been known for several years, in particular laser sources having distributed Bragg reflectors (DBR lasers).

In this respect, reference may be made to the following publications:

[1] "High performance tunable 1.5 µm InGaAs/InGaAsP multiple quantum well distributed Bragg reflector laser", T. L. Koch, U. Koren and B. I. Miller, Applied Physics Letters, 53 (12), 1988, p. 1036; and

[2] "Focused ion beam lithography of multiperiod gratings for a wavelength-division-multiplexed transmitter laser array", I. M. Templeton et al., Journal of Vacuum Science and Technology, Part B, Vol. 13, No. 6, November 1995, pp. 2722–2724.

Making such components nevertheless requires implementing several stages of epitaxial regrowth, and is therefore complex.

Also known, in particular from U.S. Pat. No. 4,993,036, are laser-emitting components that integrate on a common substrate a plurality of laser-emitting sources having Bragg gratings with different periods.

Nevertheless, implementing a plurality of different-pitch gratings at micrometer scale and disposed beside one another is technologically complicated.

More recently, the following publication

[3] "Control of lasing wavelength in distributed feedback lasers by angling the active stripe with respect to the grating", W. T. Tsang, R. M. Kapre, R. A. Logan and T. Tanbun-Ek, IEEE Photonics Technology Letters, Vol. 5, NO. 9, 1993, pp. 978–980, has proposed a component comprising, on a common substrate, both a constant pitch Bragg grating and a plurality of buried ribbons forming active layers for laser emission, the various ribbons being inclined at different angles relative to the diffraction grating.

The emission wavelengths of the various sources constituted in that way varies with the angle of inclination between the diffraction grating and the ribbon forming the active layer.

Nevertheless, those components suffer from fiber connection problems.

The materials used for fabricating them have refractive indices of the order of 3.5. Given that the various ribbons forming active layers are at different inclinations relative to the cleavage plane of the substrate, refraction gives rise to large amounts of variation in the angles at which the emitted beams are output into the air relative to the normal to the cleavage plane of the component.

It is therefore necessary to provide a different fiber inclination for each emitted wavelength.

OBJECTS AND SUMMARY OF THE INVENTION

An object of the invention is to propose a multi-wavelength laser-emitting component that enables these various drawbacks to be obviated.

According to the invention, this object is achieved with a multi-wavelength laser-emitting component presenting a plurality of Bragg grating laser-emitting sources, wherein the Bragg gratings of said sources correspond to a diffraction grating common to the various sources, with the pitch thereof varying continuously from one source to another.

Such a device has only one diffraction grating.

It is simpler to make.

Fiber connection thereto is also easy.

BRIEF DESCRIPTION OF THE DRAWING

Other characteristics and advantages of the invention appear further from the following description. This description is purely illustrative and non-limiting. It should be read with reference to the accompanying drawing, in which.

MORE DETAILED DESCRIPTION

Figure 1:
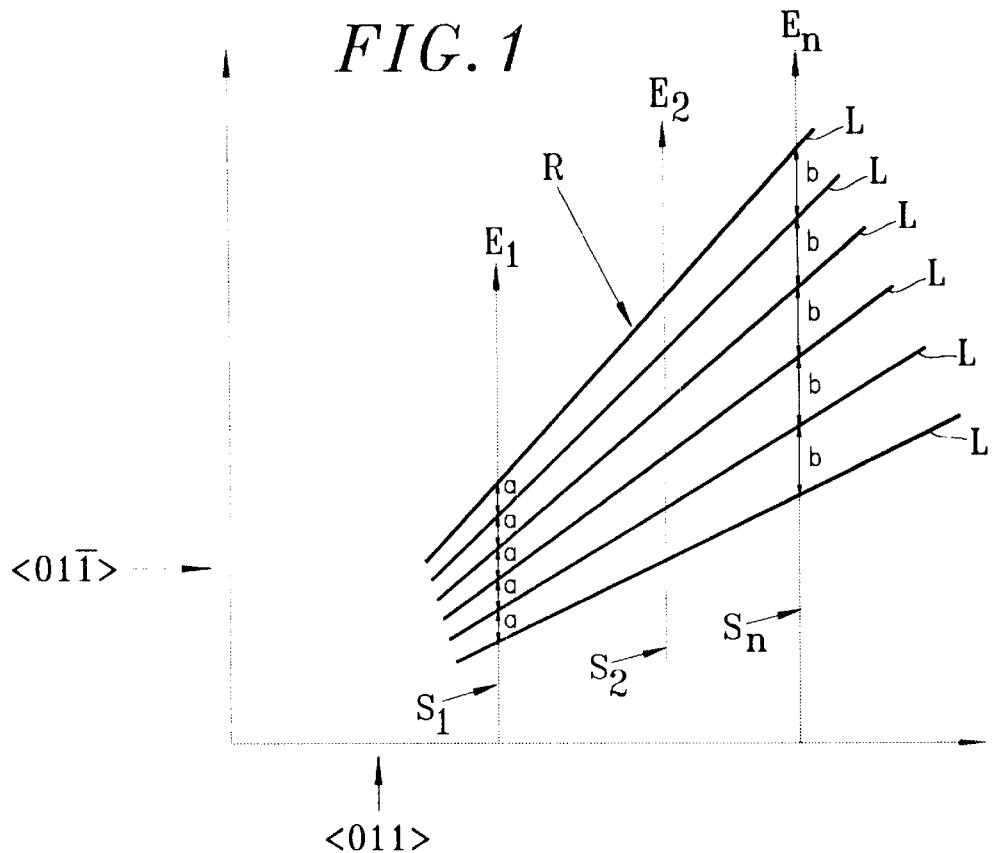
FIG. 1 is a diagrammatic plan view of a laser-emitting component in accordance with one possible embodiment of the invention.
Figure 2:
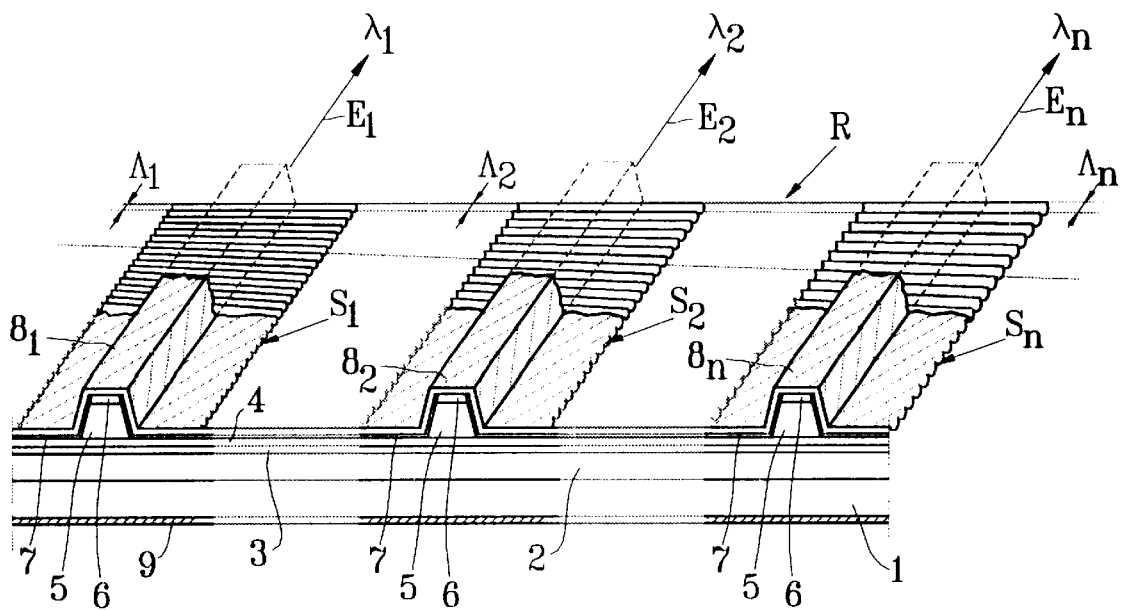
FIG. 2 is a partially cutaway perspective view of the FIG. 1 component.

The component shown in FIGS. 1 and 2 has a plurality of distributed feedback laser-emitting sources $S_1, S_2, \ldots, S_n$ (DFB laser sources), presenting a common diffraction grating R whose pitch varies continuously from one source to another.

In the particularly advantageous embodiment shown in FIGS. 1 and 2, the common diffraction grating is fan-shaped.

FIG. 1 shows the lines L of the common diffraction grating R, and also the various emission directions $E_1, E_2, \ldots, E_n$ of the sources $S_1, S_2, \ldots, S_n$.

These various lines L of the grating R are distributed in such a manner as to define a periodic grating at the level of each of the sources $S_1, S_2, \ldots, S_n$.

It will be observed that by simple proportion, if successive pairs of lines L are spaced apart at a constant distance where they cross the emission direction of one of the sources, then the same applies where they cross the emission directions of the other sources, providing the various emission directions $E_1, E_2, \ldots, E_n$ of the sources $S_1, S_2, \ldots, S_n$ of the component are mutually parallel. In FIG. 1, pairs of successive lines of the grating are spaced part at a constant distance a along emission direction $E_1$. Consequently, along emission direction $E_n$ parallel to the direction $E_1$, the distance between successive pairs of lines is likewise constant.

The pitches $\Lambda$ of the periodic diffraction gratings defined in this way by the common grating R for each source $S_1, S_2, \ldots, S_n$, are naturally different from one source to another.

The angle between two successive lines of the grating R, and the emission directions $E_1, E_2, \ldots, E_n$ are selected as a function of the Bragg wavelengths $\lambda_{b1}, \lambda_{b2}, \ldots, \lambda_{bn}$ desired for the various sources of the component.

It is recalled that the Bragg wavelength $\lambda_b$ of a DFB laser-emitting source is related to the pitch $\Lambda$ of its periodic grating by the relationship:

$$\lambda_b = 2n_{eff}\Lambda/m$$

where $n_{eff}$ is the effective refractive index of the waveguide and m is the order of diffraction by the grating.

For a given source, the feedback is wavelength selective in the vicinity of its Bragg wavelength.

In a practical embodiment, the component of the invention invention can be of the type described in which the various Bragg gratings are constituted by a common Bragg grating of the same type as the grating R described above.

A component of this kind is shown in FIG. 2.

It comprises a substrate 1 of $n^+$ doped GaAs having a thickness of about 100 μm, and having deposited thereon an $Al_{0.5}Ga_{0.5}As$ confinement layer 2, a 0.1 μm thick active layer 3, and a guiding layer 4, that is likewise 0.1 μm thick.

The fan-shaped diffraction grating R is made by insolation over the entire top face of the layer 4, with the lines of the grating being oriented relative to the cleavage planes (0, 1, −1) and (0, 1, 1) of the substrate 1 when said substrate is oriented in the (1, 0, 0) plane (see FIG. 1).

The grating may be etched line by line, for example, with the sample being displaced for each line in translation beneath the insolation beam. To this end, the sample is mounted on a sample carrier that is movable, both in translation beneath the insolation beam, and also in rotation about the point where the various lines of the grating meet.

To etch a line, the sample carrier is fixed in rotation and is moved in translation beneath the beam. After a line has been etched, the sample carrier is displaced angularly to the position enabling the following line to be etched, and so on.

On the waveguide layer 4 etched in this way, a new confinement layer 5 of $Al_{0.5}Ga_{0.5}As$ (p-type top confinement) is deposited, and then a "contact" p-type GaAs layer 6 is deposited thereafter. The stack of layers 5 and 6 is cut into ribbon form up to the grating. An electrically insulating layer 7 is deposited on either side of each ribbon. Finally, each ribbon receives a respective electrode $8_1$, $8_2$, . . . , $8_n$: these electrodes are electrically insulated from one another.

An ohmic contact 9 is formed on the substrate. After cleavage in planes perpendicular to the ribbons, diode strips are defined.

The various emission ribbons defined in this way are all parallel, e.g. being perpendicular to one of the cleavage planes of the substrate ((0, 1, 1) plane in FIG. 1).

Naturally, the teaching of the present invention is not limited to this particular component but applies in general manner to any multi-wavelength strip having Bragg grating sources.

I claim:

1. A multi-wavelength laser-emitting component presenting a plurality of Bragg grating laser-emitting sources, wherein the Bragg gratings of said sources correspond to a diffraction grating common to the various sources, with the pitch thereof varying continuously from one source to another.

2. A component according to claim 1, wherein the diffraction grating is fan-shaped, the emission directions of the various sources being parallel to one another and intersecting the lines of the diffraction grating.

3. A component according to claim 1, wherein the laser-emitting sources are distributed feedback laser-emitting sources.

4. The use of a component according to claim 1 in wavelength multiplexing for optical telecommunications.

* * * * *

UNITED STATES PATENT AND TRADEMARK OFFICE
CERTIFICATE OF CORRECTION

PATENT NO.    : 5,930,278
DATED         : July 27, 1999
INVENTOR(S)   : Menigaux It is certified that error appears in the above-identified patent and that said Letters Patent is hereby corrected as shown below:

<u>Item [56]</u>
Delete "Blakely Sokoloff Taylor &" and insert -- Blakely, Sokoloff, Taylor & --.

<u>Column 2,</u>
Line 64/65, delete "the inven-tion" and insert -- the --.
Line 65, delete "described in which" and insert -- described in US Patent # 4,933,036, in which --.

Signed and Sealed this

Third Day of July, 2001

*Attest:*

NICHOLAS P. GODICI
*Attesting Officer*     *Acting Director of the United States Patent and Trademark Office*